United States Patent
Mertens et al.

(10) Patent No.: US 6,261,377 B1
(45) Date of Patent: Jul. 17, 2001

(54) METHOD OF REMOVING PARTICLES AND A LIQUID FROM A SURFACE OF SUBSTRATE

(75) Inventors: Paul Mertens, Haacht; Mark Meuris, Keerbergen; Marc Heyns, Linden, all of (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 0 days.

(21) Appl. No.: 09/159,679

(22) Filed: Sep. 24, 1998

Related U.S. Application Data

(60) Provisional application No. 60/059,929, filed on Sep. 24, 1997, and provisional application No. 60/066,164, filed on Nov. 19, 1997.

(51) Int. Cl.$^7$ ............................... B08B 7/00; B08B 7/04
(52) U.S. Cl. ................... 134/6; 134/6; 134/18; 134/26; 134/30; 134/32; 134/902; 15/77; 15/102
(58) Field of Search ............... 15/102, 77, 88.2, 15/88.3, 308, 97.1; 134/902, 6, 18, 26, 30, 32, 34, 37; 34/443, 445

(56) References Cited

U.S. PATENT DOCUMENTS

| | | |
|---|---|---|
| 4,027,686 | 6/1977 | Shortes et al. . |
| 5,271,774 | 12/1993 | Leenaaars et al. . |
| 5,581,837 * | 12/1996 | Uchiyama et al. ...................... 15/77 |
| 5,601,655 * | 2/1997 | Bok et al. .................................. 134/1 |
| 5,660,642 * | 8/1997 | Britten ..................................... 134/30 |
| 5,806,137 * | 9/1998 | Ishi et al. .............................. 15/77 X |
| 5,933,902 * | 8/1999 | Frey ........................................ 15/102 |
| 6,070,284 * | 6/2000 | Garcia et al. .......................... 15/102 |

FOREIGN PATENT DOCUMENTS

| | | |
|---|---|---|
| 385536 * | 9/1990 | (EP) . |
| 09162159 | 6/1997 | (JP) . |
| 07211686 | 8/1997 | (JP) . |

OTHER PUBLICATIONS

Hymes et al, Brush Scrubbing Emerges as Future Wafer-—Cleaning technology, internet version of Solid State Technology, 40(7), Jul. 1997.*

* cited by examiner

*Primary Examiner*—Alexander Markoff
(74) *Attorney, Agent, or Firm*—McDonnell Boehnen Hulbert & Berghoff

(57) ABSTRACT

The present invention is related to a method of removing particles and a liquid from a surface of a substrate using at least one rotating cleaning pad. The approach, according to the present invention, is a technique wherein a sharp liquid-vapor boundary is created on the surface of the substrate adjacent to the last wetted rotating cleaning pad of a plurality of rotating cleaning pads and particularly between this last wetted rotating cleaning pad and a first edge of the substrate.

25 Claims, 2 Drawing Sheets

METHOD OF REMOVING PARTICLES AND A LIQUID FROM A SURFACE OF SUBSTRATE

REFERENCE TO RELATED APPLICATIONS

This application claims priority benefits under 35 U.S.C. § 119 to U.S. provisional application Ser. No. 60/059,929, filed on Sep. 24, 1997, and to U.S. provisional application Ser. No. 60/066,164, filed on Nov. 19, 1997.

FIELD OF THE INVENTION

The present invention is related to a method of cleaning and removing a liquid from a surface of a substrate by means of a rotating cleaning pad. Said method can be used in the fabrication process of integrated circuits, especially when the preceding processing step has heavily contaminated the surface.

BACKGROUND OF THE INVENTION

In general, the complete and efficient removal of a liquid from a surface of a substrate is a multiply repeated step in e.g. the fabrication process of integrated circuits. Such a step can be performed after a wet etching step or a wet cleaning step or a wet rinsing step or any other step used in said fabrication process wherein said substrate is treated or exposed or immersed in a liquid. Said substrate can be a semiconductor wafer or a part thereof or a glass slice or any other slice of an insulating or conductive material.

The manufacturing of integrated circuits evolves towards processing of each substrate individually rather than in batches of several substrates. In the state of the art of IC manufacturing, most processing steps, such as implantation steps, deposition steps, are already performed in a single substrate mode. On the other hand, wet processing steps, such as cleaning steps and subsequent liquid removal steps, are typically performed in a batch mode because of a lack of appropriate alternatives. Therefore, differences in waiting times are created for each individual substrate between a wet processing step, performed in a batch mode and another processing step, performed in a single substrate mode. Such variability is undesirable with regard to process control. Moreover this mixed batch and single substrate processing increases the cycle time, which is also undesirable. Therefore, there is a general interest in the development of competitive single substrate wet processing steps. Particularly, one of the major challenges regarding single wafer wet processing is a method for removing a liquid from both sides of a substrate. There are two major requirements to be fulfilled for such a method. First, it should work sufficiently fast. In state of the art production lines, a substrate is processed typically every 2 to 3 minutes. Ideally, in order to avoid equipment duplication, the liquid removal should be completed in about such a time frame. Another requirement is related to the preferred orientation of the substrate. State of the art processing equipment and transportation tools are developed to handle substrates in a horizontal position. Therefore in order to avoid additional substrate handling, it would be desirable to perform the wet processing steps using horizontally positioned substrates.

In the European Patent EP 0 385 536 B1, a method is disclosed of drying substrates after treatment in a liquid by pulling said substrate slowly out of said liquid. However, to be effective, this known method, which is based on the marangoni principle, requires that the substrates are pulled out of the liquid in an upright position, i.e. a surface of said substrate is about perpendicular to the surface of the liquid bath (as can be seen in FIGS. 1 to 6 of the European Patent EP 0 385 536 B1). This handling is incompatible with the majority of the other process steps where the equipment and transportation tools are developed to handle horizontal positioned substrates.

In the U.S. Pat. No. 5,271,774, a spin-drying technique is disclosed which is able to handle horizontal positioned substrates. In fact, several small liquid islands are formed being removed from the substrate by a rotary movement. It is known that such a spin-drying technique leaves undesirable residues, often referred to as drying marks, on the substrate surface, particularly on surfaces having mixed hydrophilic and hydrophobic regions. Furthermore, this technique is not suited to remove residual contamination in the form of particles.

It is clear from the above discussion that there is a general interest in single wafer wet processing and drying. Therefore, an efficient drying technique which also has good cleaning capabilities is a prerequisite. For some inherently dirty processes such as chemical mechanical polishing, cleaning steps making use of a mechanical force are used nowadays. For instance, CMP machines typically used for planarizing or smoothing a semiconductor wafer surface employ a polish slurry containing generally sub-micron sized abrasive particles of a material such as silica or alumina. Large quantities of such particles, along with particles removed from the wafer itself during the polishing operation, may be found on a polished wafer surface. These particles must be removed in a cleaning step or they may drastically affect device yield.

For instance, in the U.S. Pat. No. 5,581,837, disk-shaped objects, e.g. wafers, are transported one at the time between a set of rotating brushes so as to be cleaned thereby. In fact, in the presence of a cleaning liquid, a mechanical force is exerted on the surface of the wafer by means of the rotating brushes to get the wafers cleaned. This cleaning step can be followed subsequently by a rinsing step and a separate drying step. In this drying step, IR lamps are used to performing the drying. It is known that such a technique leaves drying marks on the surface of the substrate.

SUMMARY OF THE INVENTION

In an aspect of the invention, a method for removing of contamination particles and a liquid from a surface of a substrate using at least one rotating cleaning pad is disclosed. This rotary cleaning pad is preferably cylindrical shaped and has an outer edge which can contact a surface of a substrate. Particularly, a method is disclosed for the removal of particles and a liquid from at least one surface of a substrate using a plurality of rotating cleaning pads comprising the steps of:

creating a relative linear motion at a predetermined speed between a plurality of wetted rotating cleaning pads and a substrate;

contacting said surface of said substrate at a first edge with each of the wetted rotating cleaning pads of said plurality of wetted rotating cleaning pads each time that during said relative linear motion said wetted rotating cleaning pad arrives at said first edge;

applying a gaseous substance on said surface adjacent to a last wetted rotating cleaning pad, being the last wetted rotating cleaning pad of said plurality of rotating cleaning pads arriving at said first edge, and between said last wetted rotating cleaning pad and said first edge, said gaseous substance being at least partially miscible with said liquid and when mixed with said liquid yielding a mixture having a surface tension being lower than that of said liquid; and continuing said linear relative motion from said first edge to a second edge, opposite to said first edge, while contacting said surface of said substrate with said plurality of wetted rotating cleaning pads and while supplying said gaseous substance to thereby remove said particles and said liquid from said surface of said substrate. Said gaseous substance can comprise a vaporised substance which is miscible with said liquid and when mixed with said liquid yields a mixture having a surface tension being lower than that of said liquid. A vaporised substance is defined as a mist of finely dispersed liquid droplets of an element or a compound or a mixture of elements or as a vapor. A vapor is defined as the gas phase occurrence of an element or of a compound or of a mixture of elements if the element or compound or mixture should be in the liquid or solid phase at the given temperature and pressure conditions. Thus a vapor can co-exist in one environment with the solid or liquid phase of the element. A vapor is a specific gas phase occurrence of an element or a compound or a mixture of elements. Said gaseous substance can comprise a gas which is miscible with said liquid and when mixed with said liquid yields a mixture having a surface tension being lower than that of said liquid. Said gaseous substance can comprise a mixture of a vaporised substance and a gas, particularly an inert gas like e.g. helium, argon or nitrogen, said mixture being at least partially miscible with said liquid and when mixed with said liquid yielding a mixture having a surface tension being lower than that of said liquid. In an embodiment of the invention, said cleaning pad is moved relative to said substrate while wetting said rotating cleaning pad by supplying liquid to said rotating pad or to said first portion of said surface adjacent to said rotating cleaning pad.

The approach, according to the present invention, is a technique wherein a very sharp liquid-vapor boundary is created on said surface of said substrate adjacent to said last rotating cleaning pad between said last wetted rotating cleaning pad and said first edge.

The relative linear motion can be created in an arbitrary direction including a vertical motion or an horizontal motion. The substrates and/or the cleaning pads can be advanced. Particularly, a transportation belt can be used to advance the substrates.

In another embodiment of the invention, the rotary cleaning pad and particularly the last rotating cleaning pad is cylindrical shaped and has an outer edge which can contact a surface of a substrate. Preferably this outer edge of the cleaning pads is wider than the width of the area of the surface in contact with the cleaning pad. In other words, when contacting said surface, at least a part of the outer edge of the cleaning pad extends beyond the edges of the substrate. Preferably, the rotating cleaning pad is selected such that when wet and when a predetermined pressure is exerted on said cleaning pad a continuous contact area is created between the cleaning pad and the surface of the substrate. More preferably said rotary cleaning pad has a polymeric smooth outer edge. The pad may further comprise a layer underlying said polymeric outer edge, said layer being more compressible than said polymeric outer edge.

In another embodiment of the invention, a method is disclosed for cleaning and removing a liquid from a surface of a substrate using a pair of rotating cleaning pads. Said rotating cleaning pads are arranged in parallel and spaced apart one above the other. A first rotating cleaning pad is used for contacting a first surface of the substrate, a second cleaning pad is used for contacting a second surface of said substrate opposite to said first surface. The rotating cleaning pads and the substrate are handled such that a substrate can be advanced at an adjustable speed through said pair of rotating pads from said first edge of said substrate to said second edge of said substrate, said second edge being opposite to said first edge. Alternatively, the rotating cleaning pads and the substrate can be handled such that said pair of rotating cleaning pads can be advanced at an adjustable speed from said first edge of said substrate to said second edge of said substrate, said second edge being opposite to said first edge.

In another embodiment of the invention, two sets of rotating cleaning pads can be used for removing particles and a liquid from a surface of a substrate. A first set of rotating cleaning pads is used for contacting a first surface of the substrate, said first set comprising a first plurality of wetted rotating cleaning pads, a second set of rotating cleaning pads is used for contacting a second surface of said substrate opposite to said first surface, said second set comprising a second plurality of wetted rotating cleaning pads. The rotating cleaning pads within each set are parallel to and spaced apart one from the other, while each rotating cleaning pad of the first set is spaced apart from and face in face to a rotating cleaning pad of the second set one above the other. In the latter case a gaseous substance is only supplied after and adjacent to the last rotating cleaning pad at each surface to thereby clean and dry said surface.

In another aspect of the invention, a method is disclosed for the removal of particles and a liquid from at least one surface of a substrate using a plurality of rotating cleaning pads comprising the steps of:

creating a relative linear motion at a predetermined speed between a plurality of wetted rotating cleaning pads and a substrate;

contacting said surface of said substrate at a first edge with each of the wetted rotating cleaning pads of said plurality of wetted rotating cleaning pads each time that during said relative linear motion said wetted rotating cleaning pad arrives at said first edge;

locally heating said liquid on said surface adjacent to a last wetted rotating cleaning pad, being the last wetted rotating cleaning pad of said plurality of rotating cleaning pads arriving at said first edge, and between said last wetted rotating cleaning pad and said first edge, to thereby locally reduce the surface tension of said liquid; and continuing said linear relative motion from said first edge to a second edge of said substrate, opposite to said first edge, while contacting said surface of said substrate with said plurality of wetted rotating cleaning pads and while locally heating said liquid to thereby remove said particles and said liquid from said surface of said substrate. To initiate the drying process, the liquid is locally heated by a heat source to reduce the surface tension to thereby create a sharply defined liquid-ambient boundary on said surface of said substrate adjacent to said last rotating cleaning pad between said last wetted rotating cleaning pad and said first edge. Particularly, the heat source can be a nozzle, movable or not, or a static inlet dispensing a heated gas or a heated vapor or a heated mixture of a vapor and a gas. But also other heat sources can be used such as laser beams or other energetic beams, provided that they can be sufficiently localized.

BRIEF DESCRIPTION OF THE DRAWINGS

FIG. 1 represents a schematic cross-section of a wet processing tool, according to an embodiment of the invention, wherein a substrate is advanced through two revolving scrubbers to thereby clean and dry said substrate.

FIG. 2 represents a schematic cross-section of a wet processing tool, according to an embodiment of the invention, wherein two revolving cleaning pads are advanced across a fixed substrate to thereby clean and dry said substrate.

As illustrated in FIG. 2, a substrate (1) is placed between two movable revolving cleaning pads (4). A first movable arm (5), is placed close to the first rotating cleaning pad at the top side of the substrate while a second movable arm (5) is placed close to a second cleaning pad at the bottom side of said substrate. The arms comprise at least one nozzle (6) for supplying a surface tension reducing vapor to the substrate.

DETAILED DESCRIPTION OF THE INVENTION

Figure 1A:
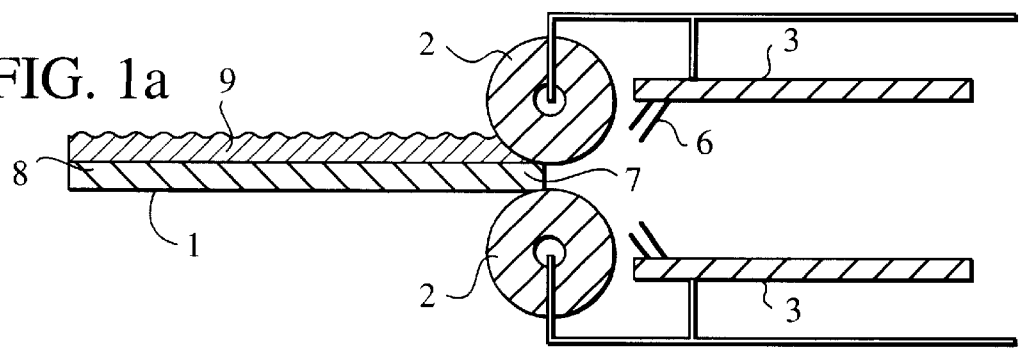
In FIG. 1a, the rotating cleaning pads (2) contact the substrate (1) at a first edge (7).

In relation to the appended drawings the present invention is described in detail in the sequel. Several embodiments are disclosed. It is apparent however that a person skilled in the art can imagine several other equivalent embodiments or other ways of executing the present invention, the spirit and scope of the present invention being limited only by the terms of the appended claims.

In an embodiment of the invention a method of removing particles and a liquid from a surface of a substrate using at least one rotating cleaning pad is disclosed. The approach, according to the present invention, is a technique wherein a sharp liquid-vapor boundary is created on said surface of said substrate adjacent to said last wetted rotating cleaning pad between said last wetted rotating cleaning pad and said first edge of said substrate. The configuration is such that the liquid is kept at the portion of the surface to be cleaned adjacent to said rotating cleaning pad contacting the surface. A gaseous substance is supplied adjacent to and at the other side of the rotating pad on the portion of said surface which is already cleaned. Said gaseous substance is at least partially miscible with said liquid and when mixed with said liquid results in a surface tension reduction of said liquid thereby enhancing the movement of said liquid towards the rotating cleaning pad. The part of the surface left behind, i.e. said second portion is cleaned and dried. It is presumed that the cleaning of said surface results partly from the frictional cleaning of a rotating cleaning pad contacting the substrate. This frictional cleaning performance can be controlled by adjusting the rotational speed of the cleaning pad, by adjusting the speed of the relative movement of the substrate to the cleaning pad and by adjusting the pressure at which the rotating cleaning pad is pressed on the surface of the substrate. Particularly if the rotating cleaning pad is brought in contact with a surface of the substrate at a predetermined pressure and no extra force would be exerted either on said cleaning pad or on said substrate, the substrate would be advanced solely due to the rotary motion of said cleaning pad. In such a case, the cleaning pad would hardly exert a frictional force on said surface. If, for instance, the speed of the relative motion of the cleaning pad to the substrate is controlled, then this speed can be adjusted, e.g. be lowered or reversed, in order to increase the frictional force of the rotating cleaning pad on the surface to thereby enhance the cleaning performance, i.e. the removal of particles. This frictional cleaning forms the mechanical component of the cleaning action, while by the selection of the liquid also a chemical cleaning component can be introduced. Besides the removal of the particles also the liquid is removed. It is presumed that this drying action is obtained due the combination of at least the chemical and mechanical component of the cleaning action and the Marangoni effect. According to this effect, said gaseous substances will be at least partially mixed with the liquid such that in the liquid meniscus, its concentration decreases in the direction of the liquid. This gradient in concentration creates an additional force exerted on the liquid film in the direction of the liquid film, resulting in a good drying performance. Moreover, also the cleaning performance can be enhanced due to the Marangoni effect and especially by the creation of a liquid-vapor boundary.

The liquid is selected dependent upon the preceding processing step and particularly the degree of contamination present on a surface of the substrate. A cleaning liquid or a rinsing liquid can be used. To initiate the drying process, a gaseous substance reducing the surface tension of said liquid is dispensed on at least one surface of said substrate. Particularly, a pressurized gaseous substance is actively supplied e.g. by using at least one inlet, said inlet preferably being movable and comprising at least one nozzle. More particularly a rectangular nozzle can be used, parallel to said rotating cleaning pad, for dispensing said gaseous substance on said second portion of said surface, said nozzle having a very limited width, i.e. typically in the range from 0.1 to 10 mm and an extended length being parallel to the rotary axis of the rotating cleaning pad, i.e. at least as long as the maximum width of the substrate. The length from such a line-shaped nozzle can be typically in the range from 10 to 30 cm. Instead of one line-shaped nozzle, a plurality of small circular nozzles can be provided along the rotary axis of the cleaning pad. Particularly, said surface tension reducing gaseous substance can be isopropyl alcohol (IPA).

The rotary cleaning pads are preferably cylindrical shaped and have an outer edge which can contact a surface of a substrate. Also scrubbers and brushes can be used as cleaning pads. More preferably, the rotating cleaning pad and especially the last rotating cleaning pad is selected such that when wet and when a predetermined pressure is exerted on said cleaning pad a continuous contact area is created between the cleaning pad and the surface of the substrate. Even more preferably, said rotary cleaning pad has a polymeric smooth outer edge. The pad may further comprise a layer underlying said polymeric outer edge, said layer being more compressible than said polymeric outer edge. Particularly, before contacting a surface of the substrate liquid is supplied on the rotating cleaning pads to wet these cleaning pads. Then, when contacting the surface of the substrate with the rotating cleaning pads, the liquid is transferred to the surface. The cleaning pads can comprise means for supplying additional liquid to thereby wet said cleaning pads and eventually a part of the surface which still is to be cleaned. Alternatively liquid can also be dispensed on said cleaning pads and/or on the part of the surface which still is to be cleaned. Preferably no additional liquid is supplied to or adjacent to the last rotating cleaning pad.

The liquid is chosen dependent upon the degree of contamination present on a surface of the substrate. In case a cleaning liquid is used, preferably a mixture of $NH_4OH$, $H_2O_2$ and $H_2O$; or a mixture of dilute $NH_4OH$, and $H_2O$; or a mixture of HCl, $H_2O_2$ and $H_2O$; or dilute HCl is used. In case a rinsing liquid is used, preferably $H_2O$ or any combination of $H_2O$ and an acid having a pH between 2 and 6 is used.

Said gaseous substance can comprise a vaporised substance which is miscible with said liquid and when mixed with said liquid yields a mixture having a surface tension being lower than that of said liquid. A vaporised substance is defined as a mist of finely dispersed liquid droplets of an element or a compound or a mixture of elements or as a vapor. A vapor is defined as the gas phase occurrence of an element or of a compound or of a mixture of elements if the element or compound or mixture should be in the liquid or solid phase at the given temperature and pressure conditions. Thus, a vapor can co-exist in one environment with the solid or liquid phase of the element. A vapor is a specific gas phase occurrence of an element or a compound or a mixture of elements. Said gaseous substance can comprise a gas which is miscible with said liquid and when mixed with said liquid yields a mixture having a surface tension being lower than that of said liquid. Said gaseous substance can comprise a mixture of a vaporised substance and a gas, like e.g. helium, argon or nitrogen, said mixture being at least partially miscible with said liquid and when mixed with said liquid yielding a mixture having a surface tension being lower than that of said liquid. Preferably, said vaporised substance is isopropyl alcohol (IPA), but also several other vaporised substances like e.g. diacetone, ethylglycol, methylpyrrolidon can be used.

Figure 1B:
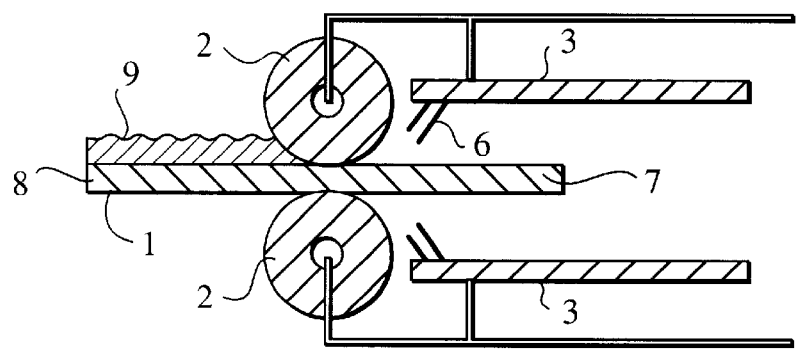
In FIG. 1b, the substrate is advanced partly through the rotating cleaning pads.
Figure 1C:
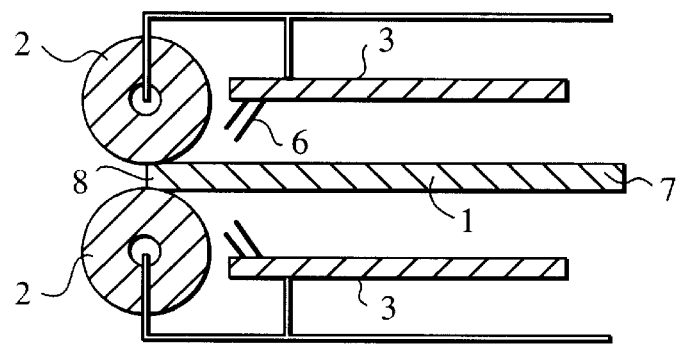
In FIG. 1c, the substrate is advanced completely through the rotating cleaning pads.

In a preferred embodiment of the invention, as illustrated in FIG. 1, a method is disclosed for removing particles and a liquid from a surface of a substrate using a pair of rotating cleaning pads. Said rotating cleaning pads are arranged in parallel and spaced apart, one above the other. A first rotating cleaning pad is used for contacting a first surface of the substrate, a second cleaning pad is used for contacting a second surface of said substrate opposite to said first surface. Particularly, a substrate (1) is placed between two revolving cleaning pads (2), said cleaning pads having a length at least as long as the length or diameter of said substrate. The substrate is preferably a thin slice or piece of material like e.g. a semiconductor wafer or a glass plate or a metal plate. A first arm (3), is placed close to said first cleaning pad at the top side of the substrate while a second arm (3) is placed close to the second cleaning pad at the bottom side of said substrate. Furthermore these arms comprise at least one nozzle (6), preferably line-shaped, for supplying a surface tension reducing vapor to both surfaces of the substrate. According to the method of the present invention, initially both wetted rotating cleaning pads each contact a surface of the substrate at a first edge (7) of the substrate (FIG. 1a).

Then, the substrate is moved through the pair of rotating cleaning pads from said first edge to a second edge (8), opposite to said first edge while supplying a gaseous substance adjacent to each revolving pad at the portion of each surface which is located between said first edge and the rotating cleaning pad (in other words, the part of the surface which is already cleaned). By doing so on both surfaces of the substrate, a liquid-vapor boundary is formed which is initially located at said first edge of said substrate. Then said substrate is advanced (FIG. 1b) through said cleaning pad to thereby guide said boundary slowly outwards from said first edge of the substrate to the opposite second edge of said substrate while removing the liquid (9) or the solution of said liquid from said surfaces of said substrate. When said opposite second edge is reached (FIG. 1c), the entire substrate is moved through the rotating cleaning pads thereby yielding a cleaned and dried substrate. Particularly, the wetted rotating cleaning pads can be brought in contact with the substrate while exerting a predetermined adjustable pressure on said cleaning pads. Both cleaning pads rotate in opposite directions, which would result in a linear movement of the substrate in a first direction at a speed dependent on the rotation speed of the cleaning pads if this movement would not be controlled. However, by controlling this linear movement, the frictional force of the rotating cleaning pads on the surfaces is controlled, thereby enhancing the cleaning performance. Particularly, the speed can be lowered or preferably even reversed which results in a linear movement in a second direction opposite to said first direction. For instance, when using cleaning pads with a diameter ranging from 1 to 6 cm, the typical rotation speed can be in the range from 0.1 to 10 rotations per second while the linear translation speed ranges typically from 1 to 10 mm per second. Note that diameter ranges and rotation speed may be chosen based on user need, so that the invention is not limited to specific diameter ranges or rotation speeds. Furthermore, the rotational speed of the cleaning pads is chosen in a manner that splashing of the liquid on the part of a surface, which is already cleaned and dried, is prevented.

Figure 2A:
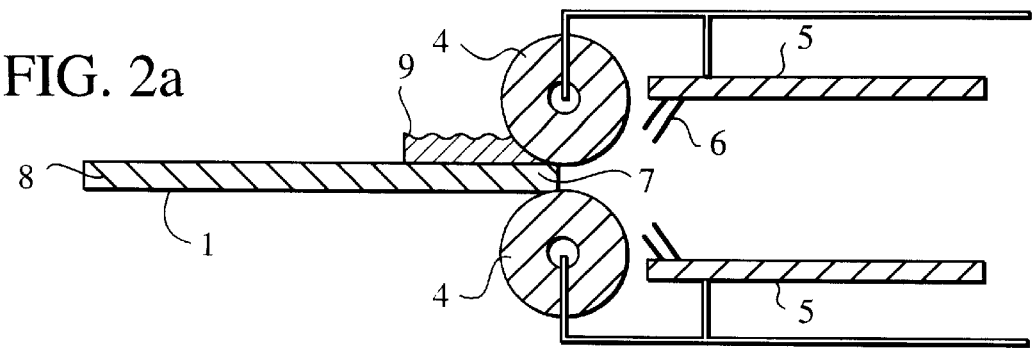
In FIG. 2a, both wetted rotating cleaning pads and both arms are positioned at an edge of the substrate and the vapor is supplied at a first side of both rotating cleaning pads.
Figure 2B:
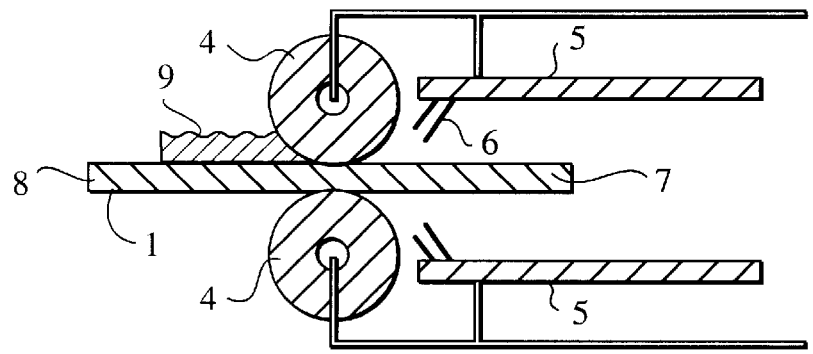
In FIG. 2b, the arms and the cleaning pads are moved simultaneously over the surfaces of the substrate in the direction of second edge (8).
Figure 2C:
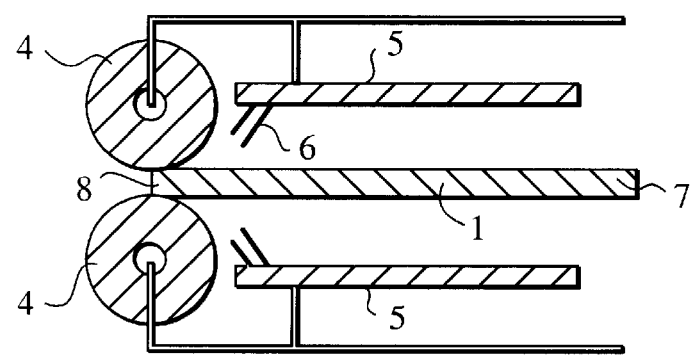
In FIG. 2c, the opposite edge (8) is reached, the entire substrate is cleaned and dried.

Alternatively, as illustrated in FIG. 2, a pair of movable cleaning pads (4) can be used. These movable rotating cleaning pads and the substrate can be handled such that said pair of movable rotating cleaning pads can be advanced in a linear movement at an adjustable speed from a first edge (7) of said substrate to a second edge (8) of said substrate, said second edge being opposite to said first edge. In particular, in FIG. 2a, both wetted rotating cleaning pads and both arms are positioned at an edge of the substrate and the vapor is supplied at a first side of both rotating cleaning pads. In FIG. 2b, the arms and the cleaning pads are moved simultaneously over the surfaces of the substrate in the direction of second edge (8). In FIG. 2c, the opposite edge (8) is reached, the entire substrate is cleaned and dried.

Figure 3:
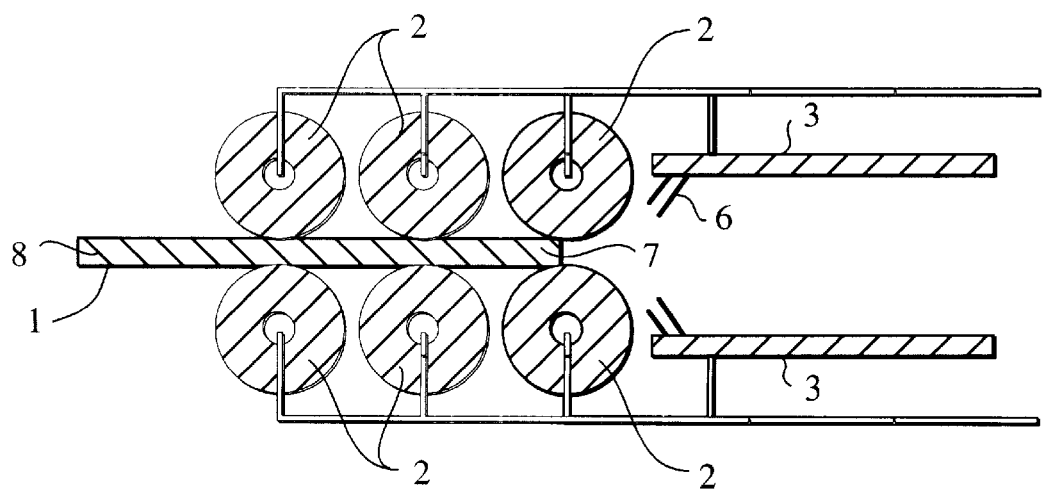
FIG. 3 represents a schematic cross-section of a wet processing tool, according to an embodiment of the invention wherein the to and bottom side of a substrate are each contacted with a plurality of rotating cleaning pads.

In an alternate preferred embodiment of the invention (FIG. 3), a method is disclosed for the removal of particles and a liquid from a first and a second surface of a substrate using a first and a second plurality of rotating cleaning pads. Particularly, said first and second surface can be the top and bottom surface of a substrate. This method comprises the steps of:

a) creating a relative linear motion at a predetermined speed between both said first and said second plurality of wetted rotating cleaning pads and said substrate; Preferably, the first plurality of wetted rotating cleaning pads and the second plurality of wetted rotating cleaning pads are moved simultaneously. The rotating cleaning pads within each plurality of wetted rotating cleaning pads are parallel to and spaced apart one from the other, while each rotating cleaning pad of said first plurality is spaced apart from and face in face to a rotating cleaning pad of said second plurality one above the other.

b) contacting said first surface of said substrate at a first edge with each of the wetted rotating cleaning pads of said first plurality of wetted rotating cleaning pads and said second surface of said substrate at said first edge with each of the wetted rotating cleaning pads of said second plurality of wetted rotating cleaning pads, said contacting being established each time that during said relative linear motion said wetted rotating cleaning pad arrives at said first edge;

c) applying a gaseous substance on said first surface adjacent to a first last wetted rotating cleaning pad, being the last wetted rotating cleaning pad of said first plurality of rotating cleaning pads arriving at said first edge, and between said first last wetted rotating cleaning pad and said first edge, said gaseous substance being at least partially miscible with said liquid and when mixed with said liquid yielding a mixture having a surface tension being lower than that of said liquid;

d) applying a gaseous substance on said second surface adjacent to a second last wetted rotating cleaning pad, being the last wetted rotating cleaning pad of said second plurality of rotating cleaning pads arriving at said first edge, and between said second last wetted rotating cleaning pad and said first edge, said gaseous substance being at least partially miscible with said liquid and when mixed with said liquid yielding a mixture having a surface tension being lower than that of said liquid; Preferably said gaseous substance is supplied simultaneous to said first and second surface of said substrate.

e) continuing said linear relative motion from said first edge to a second edge, opposite to said first edge, while contacting said first surface of said substrate with said first plurality of wetted rotating cleaning pads and said second surface of said substrate with said second plurality of wetted rotating cleaning pads and while supplying said gaseous substance to said first and second surface to thereby remove said particles and said liquid from said first and second surface of said substrate.

What is claimed is:

1. A method for the removal of particles and liquid from at least one surface of a substrate using at least one rotating pad, the method comprising the steps of:

creating a relative linear motion at a predetermined speed between the at least one rotating pad and the substrate;

contacting said surface of said substrate at a first edge with the at least one wetted rotating pad;

applying a gaseous substance on said surface adjacent to the at least one wetted rotating pad and applying the gaseous substance between the at least one wetted rotating pad and said first edge, said gaseous substance being at least partially miscible with said liquid and when mixed with said liquid yielding a mixture having a surface tension being lower than that of said liquid; and continuing said linear relative motion from said first edge to a second edge, opposite to said first edge, while contacting said surface of said substrate with the at least one wetted rotating pad and while supplying said gaseous substance, the step of continuing said linear relative motion thereby removing at least a portion of said particles and at least a portion of said liquid from said surface of said substrate.

2. A method as recited in claim 1, wherein by supplying said gaseous substance, a defined liquid-vapor boundary is created on said surface of said substrate adjacent to the at least one rotating pad.

3. A method as recited in claim 1, wherein during said relative linear motion, said liquid is supplied to the at least one wetted rotating pad contacting said surface of said substrate.

4. A method as recited in claim 1, wherein said liquid is selected from a group consisting of a mixture of $NH_4OH$, $H_2O_2$; and $H_2O$; a mixture of $NH_4OH$ and $H_2O$; a mixture of $HCl$, $H_2O_2$ and $H_2O$; a mixture of $HCl$ and $H_2O$; $H_2O$; and a mixture of $H_2O$ and an acid, said mixture of $H_2O$ and an acid having a pH between 2 and 6.

5. A method as recited in claim 1, wherein said gaseous substance comprises a vaporised substance which is miscible with said liquid and when mixed with said liquid yields a mixture having a surface tension being lower than that of said liquid.

6. A method as recited in claim 5, wherein said vaporised substance is selected from a group consisting of isopropyl alcohol (IPA), diacetone, ethylglycol, ethyllactate and methylpyrrolidon or a mixture thereof.

7. A method as recited in claim 1, wherein said gaseous substance comprises a mixture of a vaporised substance and a gas, said mixture being at least partially miscible with said liquid and when mixed with said liquid yields a mixture having a surface tension being lower than that of said liquid.

8. A method as recited in claim 7, wherein said vaporised substance is selected from a group consisting of isopropyl alcohol (IPA), diacetone, ethylglycol and methylpyrrolidon or a mixture thereof and wherein said gas is an inert gas.

9. A method as recited in claim 1, wherlin said gaseous substance comprises a gas which is miscible with said liquid and when mixed with said liquid yields a mixture having a surface tension being lower than that of said liquid.

10. A method as recited in claim 1, wherein the at least one rotating pad is cylindrical shaped and has a smooth outer edge.

11. A method as recited in claim 1, wherein a continuous contact area is formed between the at least one rotating pad and said surface.

12. A method as recited in claim 1, wherein the at least one rotating pad includes a plurality of wetted rotating pads.

13. A method for the removal of particles and a liquid from a first and a second surface of a substrate using a first and a second rotating pads, the method comprising the steps of:

creating a relative linear motion at a predetermined speed between both said first and said second wetted rotating pads and said substrate;

contacting said first surface of said substrate at a first edge of said first wetted rotating pad and said second surface of said substrate at said first edge of said second wetted rotating pad, said contacting being established each time that during said relative linear motion said wetted rotating pad arrives at said first edge;

applying a gaseous substance on said first surface adjacent to said first rotating pad, and between said first wetted rotating pad and said first edge, said gaseous substance being at least partially miscible with said liquid and when mixed with said liquid yielding a mixture having a surface tension being lower than that of said liquid;

applying a gaseous substance on said second surface adjacent to a second wetted rotating pad, and between said second wetted rotating pad and said first edge, said gaseous substance being at least partially miscible with said liquid and when mixed with said liquid yielding a mixture having a surface tension being lower than that of said liquid;

continuing said linear relative motion from said first edge to a second edge, opposite to said first edge, while contacting said first surface of said substrate with said first wetted rotating pad and said second surface of said substrate with said second wetted rotating pad and while supplying said gaseous substance to said first and second surface, the step of continuing said linear relative motion thereby removing at least a portion of said particles and at least a portion of said liquid from said first and second surface of said substrate.

14. A method for the removal of particles and a liquid from at least one surface of a substrate using at least one pair of rotating pads comprising the steps of:

creating a relative linear motion at a predetermined speed between the at least one pair of wetted rotating pads and a substrate;

contacting said surface of said substrate at a first edge with each of the wetted rotating pads of said at least one pair of wetted rotating pads each time that during said relative linear motion said wetted rotating pad arrives at said first edge;

locally heating said liquid on said surface adjacent to a last wetted rotating pad, being the last wetted rotating pad of said at least one pair of rotating pads arriving at said first edge, and between said last wetted rotating pad and said first edge, to thereby locally reduce the surface tension of said liquid; and continuing said linear relative motion from said first edge to a second edge of said substrate, opposite to said first edge, while contacting said surface of said substrate with said at least one pair of wetted rotating pads and while locally heating said liquid, the step of continuing said linear relative motion thereby removing at least a portion of said particles and at least a portion of said liquid from said surface of said substrate.

15. A method as recited in claim 14, wherein by locally heating said liquid, a defined liquid-ambient boundary is created on said surface of said substrate adjacent to said last rotating pad between said last wetted rotating pad and said first edge.

16. A method as recited in claim 14, wherein said heating is accomplished by means of dispensing a gas or a vapor or a mixture of a gas and a vapor.

17. A method as recited in claim 14, wherein said heating is accomplished by means of irradiation with an energetic beam.

18. A method as recited in claim 13, wherein the meth od of removal of particles and liquid uses a first and a second plurality of rotating pads, the first plurality of rotating pads including the first pad and the second plurality of rotating pads including the second pad, wherein the step of contacting includes contacting said first surface of said substrate at a first edge with each of the wetted rotating pads of said first plurality of wetted rotating pads and said second surface of said substrate at said first edge with each of the wetted rotating pads of said second plurality of wetted rotating pads, said contacting being established each time that during said relative linear motion said wetted rotating pad arrives at said first edge;

wherein the step of applying a gaseous substance on said first surface includes applying a gaseous substance on said first surface adjacent to a first last wetted rotating pad, being the last wetted rotating pad of said first plurality of rotating pads arriving at said first edge, and between said first last wetted rotating pad and said first edge, said gaseous substance being at least partially miscible with said liquid and when mixed with said liquid yielding a mixture having a surface tension being lower than that of said liquid;

wherein the step of applying a gaseous substance on said second surface includes applying a gaseous substance on said second surface adjacent to a second last wetted rotating pad, being the last wetted rotating pad of said second plurality of rotating pads arriving at said first edge, and between said second wetted rotating pad and said first edge, said gaseous substance being at least partially miscible with said liquid and when mixed with said liquid yielding a mixture having a surface tension being lower than that of said liquid; and wherein the step of continuing said linear relative motion includes continuing said linear relative motion from said first edge to a second edge, opposite to said first edge, while contacting said first surface of said substrate with said first plurality of wetted rotating pads and said second surface of said substrate with said second plurality of wetted rotating pad and while supplying said gaseous substance to said first and second surface to thereby remove said particles and said liquid from said first and second surface of said substrate.

19. A method as recited in claim 14, wherein the method of removal of particles and liquid uses a plurality of rotating pads, the plurality of rotating pads including the at least one pair of rotating pads, wherein the step of creating a relative linear motion includes creating a relative linear motion at a predetermined speed between the plurality of wetted rotating pads and a substrate, wherein the step of contacting includes contacting said surface of said substrate at a first edge with each of the wetted rotating pads of said plurality of wetted rotating pads each time that during said relative linear motion said wetted rotating pad arrives at said first edge, wherein the step of locally heating includes locally heating said liquid on said surface adjacent to a last wetted rotating pad, being the last wetted rotating pad of said plurality of rotating pads arriving at said first edge, and between said last wetted rotating pad and said first edge, to thereby locally reduce the surface tension of said liquid, and wherein the step of continuing said linear relative motion includes continuing said linear relative motion from said first edge to a second edge of said substrate, opposite to said first edge, while contacting said surface of said substrate with said plurality of wetted rotating pads and while locally heating said liquid to thereby remove said particles and said liquid from said surface of said substrate.

20. A method for the removal of particles and liquid on at least one surface of a substrate using at least one rotating pad, the method comprising the steps of:

creating a relative motion between the at least one rotating pad and the substrate;

contacting the surface of the substrate on a first portion of the substrate with the at least one wetted rotating pad;

applying a gaseous substance on at least a portion of the surface, the gaseous substance being at least partially miscible with the liquid and when mixed with the liquid yielding a mixture having a surface tension being lower than that of the liquid; and continuing said relative motion from the first portion of the substrate to a second portion of the substrate while contacting said surface of said substrate with the at least one wetted rotating pad and while supplying said gaseous substance, the step of continuing said relative motion thereby removing at least a portion of said particles and at least a portion of said liquid from said surface of said substrate.

21. A method as recited in claim 20, wherein the first portion of the substrate is a first edge and wherein the second portion of the substrate is a second edge, the second edge being opposite to the first edge.

22. A method as recited in claim 20, wherein the step of applying a gaseous substance includes applying the gaseous substance on said surface adjacent to the at least one wetted rotating pad.

23. A method as recited in claim 22, wherein the step of applying a gaseous substance further includes applying the gaseous substance between the at least one wetted rotating pad and said first edge.

24. A method as recited in claim 22, wherein the at least one rotating pad includes a plurality of pads, and wherein the step of applying includes applying the gaseous substance on said surface adjacent to a last wetted pad, the last wetted rotating pad being the last of said plurality of rotating pads to arrive at a first edge of the substrate.

25. A method as recited in claim 23, wherein the at least one rotating pad includes a plurality of rotating pads, and wherein the step of applying includes applying the gaseous substance on the surface between a last wetted pad and a first edge the substrate, the last wetted pad being the last of the plurality of rotating pads to arrive at the first edge of the substrate.

* * * * *